(12) United States Patent
Lin et al.

(10) Patent No.: US 10,292,283 B2
(45) Date of Patent: May 14, 2019

(54) DEVICE WITH PRINTED CIRCUIT BOARD (PCB)

(71) Applicant: VeriFone, Inc., San Jose, CA (US)

(72) Inventors: Sheng-Chieh Lin, Taipei (TW); Chih Chang Chou, Taipei (TW)

(73) Assignee: VeriFone, Inc., San Jose, CA (US)

( * ) Notice: Subject to any disclaimer, the term of this patent is extended or adjusted under 35 U.S.C. 154(b) by 0 days.

(21) Appl. No.: 15/723,656

(22) Filed: Oct. 3, 2017

(65) Prior Publication Data

US 2019/0104624 A1 Apr. 4, 2019

(51) Int. Cl.
*H05K 5/02* (2006.01)
*H01R 12/72* (2011.01)
*H05K 5/00* (2006.01)
*H05K 1/18* (2006.01)
*H05K 1/02* (2006.01)
*H05K 5/03* (2006.01)

(52) U.S. Cl.
CPC .......... *H05K 5/0217* (2013.01); *H01R 12/722* (2013.01); *H05K 1/028* (2013.01); *H05K 1/18* (2013.01); *H05K 5/0004* (2013.01); *H05K 5/0026* (2013.01); *H05K 5/03* (2013.01); *H05K 2201/10325* (2013.01)

(58) Field of Classification Search
CPC ............... H05K 5/0217; H05K 5/0026; H05K 2201/10325; H05K 1/028; H05K 1/18; H05K 5/0004; H05K 5/03; H01R 12/722
See application file for complete search history.

(56) References Cited

U.S. PATENT DOCUMENTS

| | | | | |
|---|---|---|---|---|
| 4,678,252 A * | 7/1987 | Moore | ................... | H01R 12/83 439/326 |
| 6,234,820 B1 * | 5/2001 | Perino | ................ | H01R 12/7005 439/326 |
| 6,270,369 B1 * | 8/2001 | Kato | ...................... | H01R 12/83 439/326 |
| 6,760,229 B2 * | 7/2004 | Roscoe | ................ | H05K 7/1408 257/99 |
| 6,822,878 B2 * | 11/2004 | Dobbs | ................... | H05K 1/148 361/752 |
| 6,826,638 B1 * | 11/2004 | Jaggers | ................. | G06F 1/1616 361/679.23 |
| 7,300,298 B2 * | 11/2007 | Kameda | ............... | H05K 7/1417 439/326 |
| 7,374,429 B2 * | 5/2008 | Cronch | .................. | H01R 12/79 439/496 |
| 7,762,827 B2 * | 7/2010 | Liu | .................... | H01R 12/7005 439/331 |
| 2004/0023551 A1 * | 2/2004 | Suzuki | ................. | H01R 12/592 439/495 |

(Continued)

*Primary Examiner* — Hoa C Nguyen
*Assistant Examiner* — Keith DePew
(74) *Attorney, Agent, or Firm* — Hunton Andrews Kurth LLP

(57) ABSTRACT

Devices with PCB engaging portions are disclosed. In one embodiment, a device may include: (1) a first cover comprising a base portion and a plurality of lateral portions, a first one of the lateral portions comprising a first notch; and (2) a printed circuit board (PCB) comprising a first engaging portion engageable to the first notch, the PCB positioned at an angle with respect to the base portion of the first cover when the first engaging portion is engaged to the first notch.

10 Claims, 3 Drawing Sheets

(56) References Cited

U.S. PATENT DOCUMENTS

| | | | |
|---|---|---|---|
| 2005/0048828 A1* | 3/2005 | Ho | H01R 12/52 439/326 |
| 2008/0096412 A1* | 4/2008 | Poh | H01R 13/645 439/326 |
| 2011/0008976 A1* | 1/2011 | Pipho | H01R 13/64 439/55 |
| 2011/0255245 A1* | 10/2011 | Cheng | G06F 1/203 361/695 |
| 2013/0271935 A1* | 10/2013 | Kiew | H05K 7/142 361/753 |
| 2018/0048057 A1* | 2/2018 | Ehman | H01Q 1/273 |

* cited by examiner

DEVICE WITH PRINTED CIRCUIT BOARD (PCB)

BACKGROUND OF THE INVENTION

1. Field of the Invention

The present disclosure relates generally to devices, and more particularly, to electronic devices with printed circuit boards (PCBs).

2. Description of the Related Art

Printed circuit boards (PCBs) have been mounted inside electronic devices. For example, a PCB may be installed in a predefined recess of a bottom cover of an electronic device. One or more sockets or connectors may be mounted on a surface of the PCB facing the bottom cover. When the device is being assembled, it may be difficult to access the socket or connector unless the PCB is entirely removed from the recess of the bottom cover. Furthermore, it may be difficult to disengage the PCB from the recess of the cover. In some instances, a cable or ribbon may be connected to the connector. Such a cable or ribbon may have a minimum required length to maintain electrical connection between the PCB and other components within the device while PCB is removed from the recess of the bottom cover.

These and other deficiencies exist.

SUMMARY OF THE INVENTION

Devices with PCBs are disclosed. In one embodiment, a device may include: (1) a first cover comprising a base portion and a plurality of lateral portions, a first one of the lateral portions comprising a first notch; and (2) a printed circuit board (PCB) comprising a first engaging portion engageable to the first notch, the PCB positioned at an angle with respect to the base portion of the first cover when the first engaging portion is engaged to the first notch.

In one embodiment, the device may further include a second cover engageable to the first cover, the first and second covers forming an enclosure to house the PCB.

In one embodiment, the first engaging portion may be disengageable from the first notch.

In one embodiment, a second one of the lateral portions of the first cover may comprise a second notch.

In one embodiment, the PCB may comprise a second engaging portion engageable to the second notch, the first and second engaging portions positioned opposite each other.

In one embodiment, the second engaging portion may be disengageable from the second notch.

In one embodiment, the angle between the PCB and the base portion of the first cover may be about 60° when the first engaging portion is engaged to the first notch.

In one embodiment, the angle between the PCB and the base portion of the first cover may be about 45° when the first engaging portion is engaged to the first notch.

In one embodiment, the first notch may comprise an angled notch to set the PCB in a raised position at a predetermined angle with respect to the base portion of the first cover when the first engaging portion is engaged to the first notch.

In one embodiment, the PCB may be in a flat position with respect to the base portion of the first cover when the first engaging portion is disengaged from the first notch.

In one embodiment, the first and second notches may comprise matching angled notches to set the PCB in a raised position at a predetermined angle with respect to the base portion of the first cover when the first and second engaging portions are engaged to the first and second notches, respectively.

In one embodiment, the PCB may be in a flat position with respect to the base portion of the first cover when the first engaging portion is disengaged from the first notch and the second engaging portion is disengaged from the second notch.

In one embodiment, the base portion and the plurality of lateral portions of the first cover may define a recess.

In one embodiment, the device may further comprise a connector mounted on a first surface of the PCB facing the base portion of the first cover.

In one embodiment, the connector may comprise a socket.

In one embodiment, the socket may comprise a zero-insertion-force (ZIF) socket.

In one embodiment, the PCB may comprise a flexible printed circuit (FPC).

In one embodiment, the device may comprise an electronic device, a payment terminal, a mobile device, or the like.

BRIEF DESCRIPTION OF THE DRAWINGS

For a more complete understanding of the present invention, the objects and advantages thereof, reference is now made to the following descriptions taken in connection with the accompanying drawings in which.

DETAILED DESCRIPTION OF PREFERRED EMBODIMENTS

The following descriptions provide different configurations and features according to exemplary embodiments. While certain nomenclature and types of devices/hardware are described, other names and devices/hardware usage is possible and the nomenclature provided is done so by way of non-limiting examples only. Further, while particular embodiments are described, it should be appreciated that the features and functions of each embodiment may be combined in any manner within the capability of one of ordinary skill in the art. The figures provide additional exemplary details regarding the present invention. It should also be appreciated that these exemplary embodiments are provided as non-limiting examples only.

Several embodiments of the present invention and their advantages may be understood by referring to FIGS. 1-4.

Figure 1:
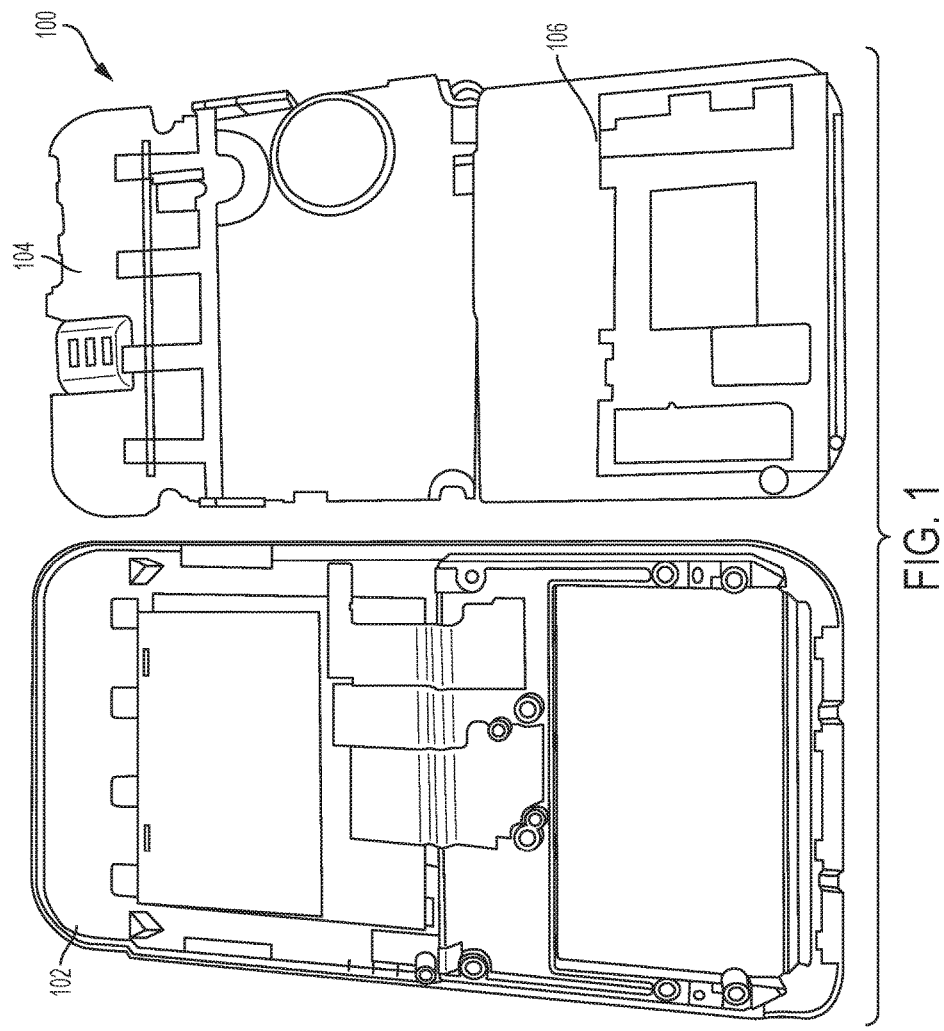
FIG. 1 depicts a front perspective view of a device with two open covers and a PCB according to one embodiment.

FIG. 1 depicts a front perspective view of device 100 with first cover 102, second cover 104, and printed circuit board (PCB) 106 according to one embodiment. Device 100 of FIG. 1 is shown in an open position with two matching covers 102 and 104 and PCB 106 within cover 104.

Cover 102 may be regarded as a top cover while cover 104 may be regarded as a bottom cover, or vice versa. When device 100 is assembled, covers 102 and 104 may be engageable to one another to form an enclosure in which PCB 106 is housed. Before device 100 is assembled, covers 102 and 104 may be separate from one another as shown in FIG. 1.

In another embodiment, PCB 106 may be positioned within cover 102 instead of cover 104. In other embodiments, one or more PCBs may be provided within one or both of covers 102 and 104.

Figure 2:
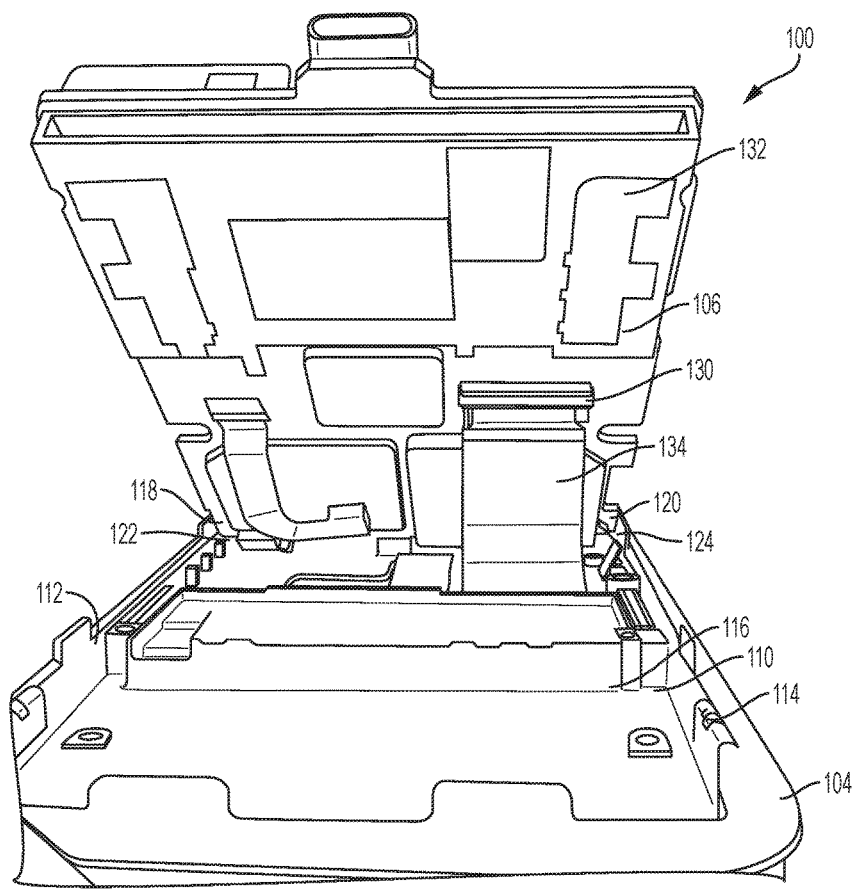
FIG. 2 depicts a front perspective view of a device with a PCB according to one embodiment.
Figure 3:
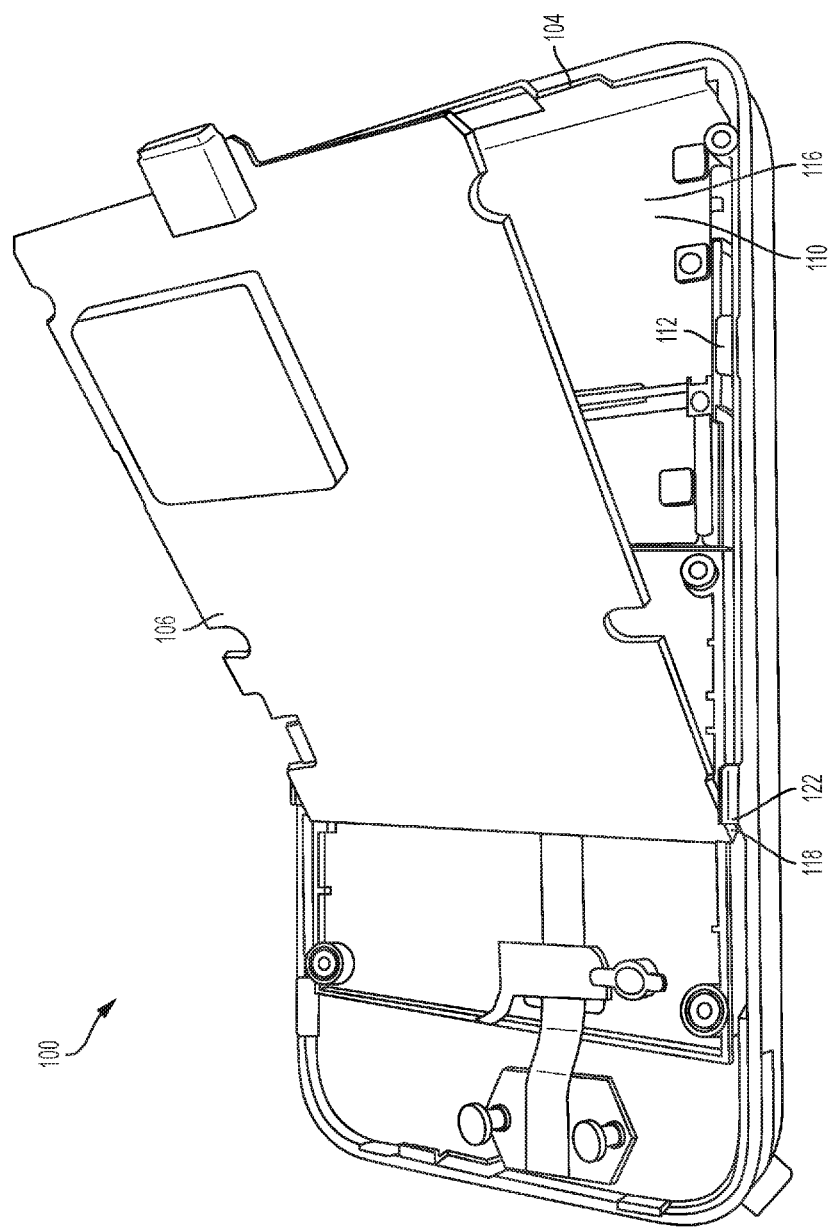
FIG. 3 depicts a side perspective view of a device with a PCB according to one embodiment.

FIGS. 2 and 3 depict front and side perspective views, respectively, of device 100 having PCB 106 positioned in a raised position, that is, at an angle with respect to cover 104, according to one embodiment. In one embodiment, cover 104 may include a base portion 110 and at least two lateral portions 112 and 114.

In one embodiment, base portion 110 and lateral portions 112 and 114 of cover 104 may define recess 116 which may be shaped and sized to receive PCB 106 when PCB 106 is in the position within cover 104 that it will lie when cover 104 and 102 are assembled together. For example, PCB 106 may be positioned in a flat position, that is, at an angle of about 0° with respect to base portion 110 of cover 104. Other orientations of PCB 106 relative to base portion 110 are possible and may be desired for assembly.

In one embodiment, PCB 106 may include first engaging portion 118. In one embodiment, PCB 106 may further include second engaging portion 120. In one embodiment, first engaging portion 118 and second engaging portion 120 may be positioned opposite each other and form an axis about which PCB 106 is rotatable with respect to base portion 110 of cover 104.

In one embodiment, first lateral portion 112 of cover 104 may include first notch 122. In one embodiment, second lateral portion 114 of cover 104 may include second notch 124 opposite from first notch 122.

Referring to FIGS. 2-3, in one embodiment, first engaging portion 118 of PCB 106 may be engageable to first notch 122 in first lateral portion 112 of cover 104. In one embodiment, second engaging portion 120 of PCB 106 may be engageable to second notch 124 in second lateral portion 114 of cover 104.

In one embodiment, PCB 106 may be rotatable within a range of angles between PCB 106 and base portion 110 of cover 104 when first and second engaging portions 118 and 120 of PCB 106 are engaged to first and second notches 122 and 124 in first and second lateral portions 112 and 114 of cover 104, respectively.

In one embodiment, first engaging portion 118 of PCB 106 may comprise a protrusion on a side of PCB 106 corresponding to first lateral portion 112 of cover 104. In one embodiment, second engaging portion 120 of PCB 106 may comprise a protrusion on a side of PCB 106 corresponding to second lateral portion 114 of cover 104.

In one embodiment, the angle between PCB 106 and base portion 110 of cover 104 may be about 60° when first engaging portion 118 is engaged to first notch 122.

In one embodiment, the angle between PCB 106 and base portion 110 of cover 104 may be about 60° when first engaging portion 118 is engaged to first notch 122 and second engaging portion 120 is engaged to second notch 124.

In one embodiment, the angle between PCB 106 and base portion 110 of cover 104 may be about 45° when first engaging portion 118 is engaged to the first notch 122.

In one embodiment, the angle between PCB 106 and base portion 110 of cover 104 may be about 45° when first engaging portion 118 is engaged to first notch 122 and second engaging portion 120 is engaged to second notch 124.

In one embodiment, PCB 106 may be rotatable within a range of angles from about 0° to a predetermined angle with respect to base portion 110 of cover 104 to set PCB 106 in a raised position.

In one embodiment, first notch 122 may comprise an angled notch to set PCB 106 in a raised position at a predetermined angle with respect to base portion 110 of cover 104 when first engaging portion 118 is engaged to first notch 122.

In one embodiment, PCB 106 may be in a flat position with respect to base portion 110 of cover 104 when first engaging portion 118 is disengaged from first notch 122.

In one embodiment, first and second notches 122 and 124 may comprise matching angled notches to set PCB 106 in a raised position at a predetermined angle with respect to base portion 110 of cover 104 when first and second engaging portions 118 and 120 are engaged to first and second notches 122 and 124, respectively.

In one embodiment, PCB 106 may be in a flat position with respect to base portion 110 of cover 104 when first engaging portion 118 is disengaged from first notch 122 and second engaging portion 120 is disengaged from second notch 124.

In various other embodiments, the angle between PCB 106 and base portion 110 of cover 104 may be any angle suitable for access to one or more components on first surface 132 of PCB 106 facing base portion 110 of cover 104.

In one embodiment, first engaging portion 118 of PCB 106 may be disengageable from first notch 122 in first lateral portion 112 of cover 104. In one embodiment, second engaging portion 120 of PCB 106 may be disengageable from second notch 124 in second lateral portion 114 of cover 104.

Referring to FIG. 2, connector 130 may be mounted on first surface 132 of PCB 106 facing base portion 110 of cover 104 in one embodiment.

In one embodiment, one or more additional connectors may be mounted on first surface 132 of PCB 106 facing base portion 110 of cover 104.

In one embodiment, connector 130 may comprise socket.

In one embodiment, connector 130 may comprise zero-insertion-force (ZIF) socket.

In one embodiment, PCB may comprise flexible printed circuit (FPC).

In one embodiment, device 100 may comprise electronic device, payment terminal, mobile device, or the like.

In one embodiment, connector 130 may be easily accessible to assembler or user when PCB 106 in a raised position, that is, at a finite angle with respect to base portion 110 of cover 104.

In one embodiment, the angle between PCB 106 and base portion 110 of cover 104 may be about 60° when PCB 106 is in a raised position.

In one embodiment, the angle between PCB 106 and base portion 110 of cover 104 may be about 45° when PCB 106 is in a raised position.

In various embodiments, the angle between PCB 106 and base portion 110 of cover 104 may be any angle suitable for assembler or user to access connector 130 mounted on first surface 132 of PCB 106 facing base portion 110 of cover 104.

In one embodiment, cable or ribbon 134 may be connected to connector 130 on first surface 132 of PCB 106 facing base portion 110 of cover 104. In one embodiment, length of cable or ribbon 134 required to maintain electrical connection between connector 130 and other components within cover 104 of device 100 when PCB 106 is propped at an angle with respect to base portion 110 of cover 104 may be shorter than length of cable or ribbon in a conventional arrangement where PCB is entirely removed from cover of device.

In one embodiment, connector 130 may be easily accessible to assembler or user when first and second engaging portions 118 and 120 of PCB 106 are disengaged from first and second notches 122 and 124 in first and second lateral portions 112 and 114 of cover 104, respectively.

Although multiple embodiments are disclosed, it should be recognized that these embodiments are not exclusive to one another, and features of one embodiment may be applied to the others as necessary and/or desired.

It will be appreciated by those skilled in the art that the various embodiments are not limited by what has been particularly shown and described hereinabove. Rather the scope of the various embodiments includes both combinations and sub-combinations of features described hereinabove and variations and modifications thereof which are not in the prior art. It should further be recognized that these various embodiments are not exclusive to each other.

It will be readily understood by those persons skilled in the art that the embodiments disclosed here are susceptible to broad utility and application. Many embodiments and adaptations other than those herein described, as well as many variations, modifications and equivalent arrangements, will be apparent from or reasonably suggested by the various embodiments and foregoing description thereof, without departing from the substance or scope of the above description.

Accordingly, while the various embodiments have been described here in detail in relation to exemplary embodiments, it is to be understood that this disclosure is only illustrative and exemplary and is made to provide an enabling disclosure. Accordingly, the foregoing disclosure is not intended to be construed or to limit the various embodiments or otherwise to exclude any other such embodiments, adaptations, variations, modifications or equivalent arrangements.

What is claimed is:

1. A device, comprising:
    a first cover comprising a base portion and a plurality of lateral portions, a first one of the lateral portions having a first angled indentation defining a first notch and a second one of the lateral portions having a second angled indentation defining a second notch, wherein the first lateral portion and the second lateral portion are substantially parallel to each other and the first notch is positioned directly opposite the second notch; and
    a printed circuit board (PCB) comprising a first engaging portion engageable to the first notch and a second engaging portion engageable to the second notch, the PCB positioned at an angle with respect to the base portion of the first cover when both the first engaging portion is engaged to the first notch and the second engaging portion is engaged to the second notch, wherein the first and second notches receive the PCB during assembly.

2. The device of claim 1, further comprising:
    a second cover engageable to the first cover, the first and second covers forming an enclosure to house the PCB.

3. The device of claim 1, wherein the first engaging portion is disengageable from the first notch and the second engaging portion is disengageable from the second notch.

4. The device of claim 1, wherein the first notch and the second notch are configured to set the PCB in a raised position when both the first engaging portion is engaged to the first notch and the second engaging portion is engaged to the second notch during assembly.

5. The device of claim 1, wherein the PCB is in a position substantially parallel with respect to the base portion of the first cover when the first engaging portion is disengaged from the first notch and the second engaging portion is disengaged from the second notch after assembly.

6. The device of claim 1, wherein the base portion and the plurality of lateral portions of the first cover define a recess.

7. The device of claim 1, further comprising:
    a connector mounted on a first surface of the printed circuit board facing the base portion of the first cover.

8. The device of claim 7, wherein the connector comprises a socket.

9. The device of claim 8, wherein the socket comprises a zero-insertion-force (ZIF) socket.

10. The device of claim 1, wherein the PCB comprises a flexible printed circuit (FPC).

* * * * *